United States Patent
Tajalli

(10) Patent No.: US 9,325,361 B2
(45) Date of Patent: Apr. 26, 2016

(54) RECEIVER SYSTEM

(71) Applicant: EM Microelectronic-Marin S.A., Marin (CH)

(72) Inventor: Armin Tajalli, Chavannes-pres-Renens (CH)

(73) Assignee: EM Microelectronic-Marin S.A., Marin (CH)

(*) Notice: Subject to any disclaimer, the term of this patent is extended or adjusted under 35 U.S.C. 154(b) by 0 days.

(21) Appl. No.: 14/062,355

(22) Filed: Oct. 24, 2013

(65) Prior Publication Data

US 2014/0119479 A1    May 1, 2014

(30) Foreign Application Priority Data

Oct. 26, 2012 (EP) .................................. 12190222

(51) Int. Cl.
| | |
|---|---|
| *H03D 1/06* | (2006.01) |
| *H04L 27/06* | (2006.01) |
| *H03K 9/02* | (2006.01) |
| *H04B 1/16* | (2006.01) |
| *H03K 9/00* | (2006.01) |
| *H03G 3/30* | (2006.01) |
| *H03K 5/007* | (2006.01) |
| *H03D 1/18* | (2006.01) |

(52) U.S. Cl.
CPC .. *H04B 1/16* (2013.01); *H03D 1/06* (2013.01); *H03D 1/18* (2013.01); *H03G 3/3052* (2013.01); *H03K 5/007* (2013.01); *H03K 9/00* (2013.01); *H03K 9/02* (2013.01); *H04L 27/06* (2013.01); *H03D 2200/0047* (2013.01)

(58) Field of Classification Search
CPC ............. H03D 1/00; H03D 1/06; H03D 1/02; H03D 2200/0047; H03D 1/18; H03K 9/02; H04L 27/06; H04B 1/16; H04B 1/22
USPC ........... 329/347, 349, 367; 375/320; 455/337, 455/341
See application file for complete search history.

(56) References Cited

U.S. PATENT DOCUMENTS

| | | | |
|---|---|---|---|
| 4,782,532 A | 11/1988 | Ecklund | |
| 2002/0044013 A1 | 4/2002 | Yoshida et al. | |
| 2003/0190775 A1* | 10/2003 | Kim et al. | ..................... 438/200 |
| 2009/0247100 A1 | 10/2009 | Meltzer et al. | |

FOREIGN PATENT DOCUMENTS

| | | |
|---|---|---|
| CN | 102185646 A | 9/2011 |
| EP | 781011 A1 * | 6/1997 |

(Continued)

OTHER PUBLICATIONS

Allen, "Lecture 320—Improved Open-Loop Comparators and Latches", 2010, retrieved from http://www.aicdesign.org/SCNOTES/2010notes/Lect2UP320_%28100328%29.pdf.*

(Continued)

*Primary Examiner* — Ryan Johnson
(74) *Attorney, Agent, or Firm* — Oblon, McClelland, Maier & Neustadt, L.L.P.

(57) ABSTRACT

A receiver circuit includes an input terminal through which an input signal is received. The receiver circuit also includes a first amplifier stage connected via its input to the input terminal of the receiver circuit; and an envelope detector stage that detects the incoming signal maxima to recover the signal envelope, where the detector stage is connected to the output of the first stage.

7 Claims, 2 Drawing Sheets

(56) References Cited

FOREIGN PATENT DOCUMENTS

EP  1 199 799 A2  4/2002
GB  2 203 908 A  10/1988

OTHER PUBLICATIONS

European Search Report issued Mar. 22, 2013, in European Application No. 12 19 0222 filed Oct. 26, 2012 (with English Translation).

* cited by examiner

RECEIVER SYSTEM

This application claims priority from European Patent application No. EP12190222.5 filed Oct. 26, 2012, the entire disclosure of which is incorporated herein by reference.

The invention concerns the field of receiver systems and/or circuits including an input terminal through which an input signal is received, said receiver circuit further including:
- a first amplifier stage connected via its input to the input terminal of said receiver circuit;
- an envelope detector stage for detecting the incoming signal maxima to recover the signal envelope, said detector stage being connected to the output of the first stage.

BACKGROUND OF THE INVENTION

It is known that devices such as mobile telephones or satellites or various portable objects are provided with transceiver circuits including a transmission loop used to transmit a signal and a receiving loop used to receive a signal. Some devices such as radio tuners are only provided with an electronic receiver circuit, i.e. having a receiving loop as shown in FIG. 1.

A receiving loop 10 includes an input terminal 4 through which an input signal is received, said receiver circuit further including:
- a first amplifier stage 6 connected via its input to the input terminal of said receiver circuit;
- an envelope detector stage 8 for detecting the incoming signal maxima to recover the signal envelope, said detector stage being connected to the output of said first stage.
- a peak detector stage 9 for detecting the peak value of the signal and adjusting the gain. This peak detector stage is also used for comparing the levels of the envelope detector stage.
- a comparator stage 12 connected between the envelope detector stage output and the peak detector stage output. The comparator stage is provided with a hysteresis module. This stage is used for delivering a receiver circuit output signal namely a square signal.

The receiver loop is also provided with a differential amplifier 11 whose negative input is connected to the peak detector stage output, the positive input allowing a reference signal to be compared to the peak detector stage output. This differential amplifier delivers a signal connected to the first amplifier stage in order to act thereon and modify the output thereof.

One drawback of this circuit is that the envelope detector stage, the peak detector stage and the connection path between the differential amplifier output and the first amplifier stage are provided with high value capacitors. The first drawback of these high value capacitors is that they are expensive. Indeed, high value capacitors, i.e. capacitors whose value attain or exceed a microfarad are made in expensive technologies and a multiplicity thereof thus increases the cost of the circuit.

Further, the size of these capacitors is generally greater, which results in a printed circuit board having a larger surface and also a higher price.

Finally, another drawback of these capacitors is that it is possible for perturbations to appear. These perturbations take the form of oscillation in the signal. Consequently, the circuit no longer operates in an optimum manner. The more the number of capacitors increases, the more the risk of oscillation will increase.

Finally, this receiver circuit has the drawback of being complex since it is not easy to combine an envelope detector stage with a peak detector stage.

SUMMARY OF THE INVENTION

It is an object of the invention to overcome the drawbacks of the prior art by proposing to provide a less expensive receiver system with improved reliability and stability.

The invention therefore concerns a receiver circuit including an input terminal through which an input signal is received, said receiver circuit further including:
- a first amplifier stage connected via one of its inputs to the input terminal of said receiver circuit and delivering an amplified signal;
- an envelope detector stage, connected to the first stage output, for detecting maxima in the amplified incoming signal in order to recover the signal envelope and deliver a signal, characterized in that said receiver circuit further includes:
- a second comparator stage including a negative input connected to the envelope detector stage output and a positive input through which a reference signal is received, said second comparator stage consisting in comparing the signal detected at the detector stage output with the reference signal to deliver a control signal sent to the first amplifier stage for varying the gain of the first amplifier stage;
- and a comparator circuit connected via a positive input to the envelope detector stage output and via a negative input to the positive input of the second amplifier stage in order to compare the envelope detector stage output with the reference signal and to deliver a demodulated output signal.

One advantage of this receiver circuit is that the number of components is limited since it is no longer necessary to use a peak detector. Consequently, the high value capacitor associated with the peak detector circuit is not used either. This results in a saving in the surface area of the printed circuit board and also a saving in terms of costs since the cost of these components is significant.

Further, the fact of limiting the number of high value capacitors leads to improved sensitivity of the receiver circuit. Indeed, high value capacitors are known to cause the appearance of perturbations which damage sensitivity.

In a first advantageous embodiment, the envelope detector stage further includes a protection capacitance.

In a second advantageous embodiment, the comparator circuit includes a comparator unit distinguishing between the envelope detector stage output signal and the second amplifier stage output signal, and a hysteresis unit.

In another advantageous embodiment, the hysteresis unit includes two pairs of transistors of the same type each including a first transistor and a second transistor, the transistors of the same pair being connected to earth, the gate of the first transistor of the first pair and the gate of the second transistor of the second pair being connected to each other so as to form a first connection point, whereas the gate of the second transistor of the first pair and the gate of the first transistor of the second pair are connected to each other so as to form a second connection point, said hysteresis unit further being arranged so that the drains of the first transistor of the first pair and of the second transistor of the second pair are connected to the comparator unit, the drains of the second transistor of the first pair and of the first transistor of the second pair being respectively connected to the drain of the second transistor of the second pair and to the drain of the first transistor of the first pair.

In another advantageous embodiment, the hysteresis unit further includes a programmable part including two programming transistors each connected via its drain to the sources of the transistors of one of the two pairs of transistors of the hysteresis unit, the sources of these programming transistors being connected to earth and the gates of each transistor forming a connection point for a programming signal.

In another advantageous embodiment, the comparator unit (BC) is connected to earth via a first regulating transistor traversed by a first regulating current, the hysteresis unit being connected to earth via a second regulating transistor traversed by a second regulating current, the hysteresis width being linked to the ratio between the second regulating current and the first regulating current.

In another advantageous embodiment, the first regulating transistor and the second regulating transistor are each formed of a multitude of transistors in parallel each able to be selectively activated or deactivated and the ratio between the second regulating current and the first regulating current is regulated by modifying the number of transistors activated for the first regulating transistor and for the second regulating transistor.

BRIEF DESCRIPTION OF THE DRAWINGS

The objects, advantages and features of the receiver system according to the present invention will appear more clearly in the following detailed description of at least one embodiment of the invention, given solely by way of non-limiting example and illustrated by the annexed drawings, in which.

DETAILED DESCRIPTION OF THE INVENTION

Figure 1:
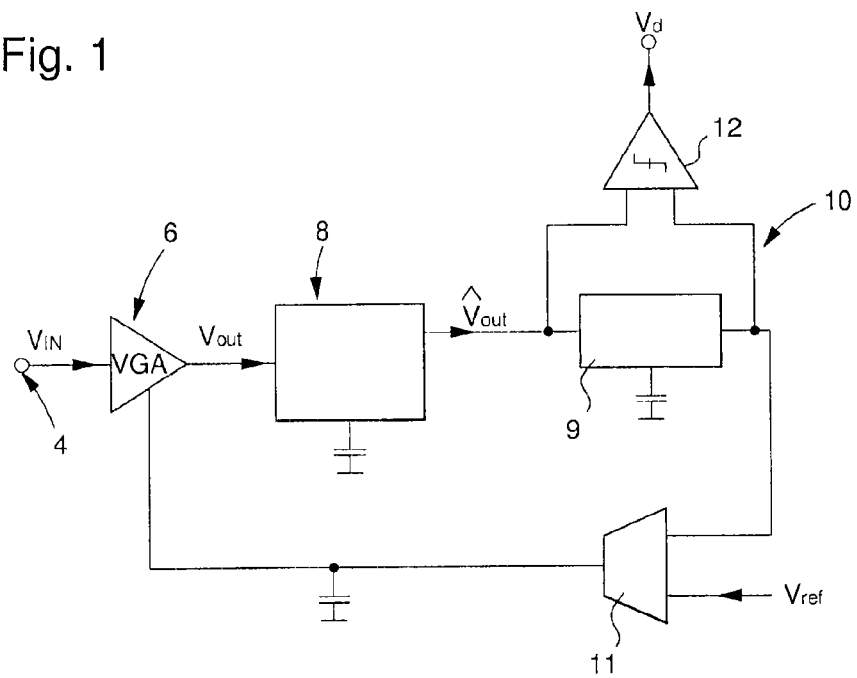
FIG. 1 is a schematic view of a prior art receiver system.
Figure 2:
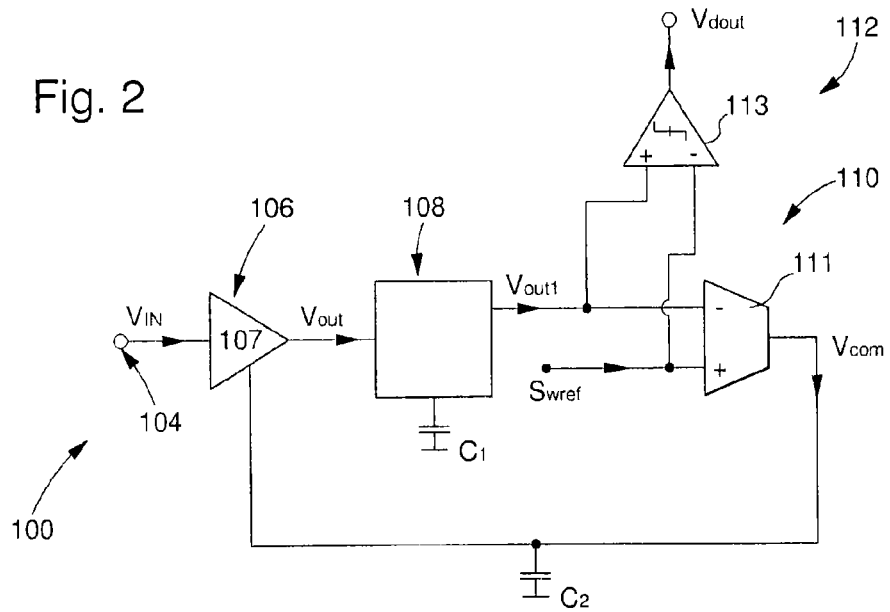
FIG. 2 is a schematic view of a receiver system according to the invention.

FIG. 2 shows a receiver circuit or system 100 according to the invention. This receiver circuit 100 includes an input 104 via which a signal is received. This signal Vin is a signal containing data which may equally be a high frequency signal or a low frequency signal. This signal Vin takes the form of an amplitude modulated signal.

This input 104 is connected to a first input of a first amplifier stage 106. First comparator stage 106 includes a low noise amplifier 107. The purpose of low noise amplifier 107 is to amplify the incoming signal to deliver an amplified input signal Vout.

The output of first amplifier 106 is connected to an envelope detector stage 108. Envelope detector stage 108 is used to demodulate the amplified input signal Vout which is the amplified incoming signal Vin, i.e. to deliver a detected signal Vout1 matching the contours of the amplified incoming signal. Envelope detector stage 108 is also used for extracting data concerning the amplitude of amplified input signal Vout. Stage 108 further includes a high value capacitor C1 connecting said envelope detector stage to earth. Capacitor C1 is used for envelope detection and for filtering high frequency signals.

Advantageously according to the invention, the output of this envelope detector stage 108 is connected to a second amplifier stage 110 which may also be called the second comparator stage. Second comparator stage 110 includes an operational transconductance amplifier 111. The detected signal Vout1 from envelope detector stage 108 is connected to the negative input of said operational transconductance amplifier 111. The positive input of said operational transconductance amplifier 111 is used so that a reference signal Vswref can be connected thereto. This reference signal Vswref takes the form of a continuous signal whose voltage value is predetermined.

Operational transconductance amplifier 111 is used to deliver, at output, a control signal Vcom used as the setpoint. This control signal Vcom is connected to a second input of the first amplifier stage 106, i.e. to a second input of low noise amplifier 107. The purpose of control signal Vcom is to act on low noise amplifier 107 so as to modify its gain for optimum demodulation.

To deliver control signal Vcom, operational transconductance amplifier 111 compares signal Vout1 to a reference signal Vswref. Signal Vout1 is transformed by operational transconductance amplifier 111. In theory, operational transconductance amplifier 111 is configured to superpose the detected signal Vout1 at the output of envelope detector stage 108 and reference signal Vswref and to calculate the area of signal Vout1 above Vswref and below Vswref. Once these areas have been calculated by integration, they are compared to each other. In practice, this calculation consists in calculating the mean of detected signal Vout1 and comparing this mean to the value of signal Vswref. Ideally, the mean value of detected signal Vout1 should be equal to the value of signal Vswref.

Thus, if output signal Vout1 of envelope detector stage 108 has a lower mean value than the mean value of reference signal Vswref, the purpose of the outgoing control signal Vcom is to increase the gain of the first amplifier stage 106. Conversely, if the detected output signal Vout1 from envelope detector stage 108 has a higher mean value than the mean value of reference signal Vswref, then the purpose of the outgoing signal Vcom is to decrease the gain of said first amplifier stage 106. However, if the detected output signal Vout1 from envelope detector stage 108 has a mean value equal to the mean value of reference signal Vswref then the gain is not modified.

This enables detected signal Vout1 to be kept within an amplitude interval. Consequently, the gain of first amplifier stage 106 is adjusted solely with envelope detector 108 and operational transconductance amplifier 111. The peak detector circuit is therefore no longer used and a more compact and less expensive circuit is obtained. Moreover, one less capacitor is used which increases the stability of the system.

Operational transconductance amplifier 111 further includes a high value capacitor C2 connected in parallel to the output of said operational transconductance amplifier 111. This capacitor is connected to earth and is used as an integrator for stabilising the receiving loop. The error is stored in capacitor C2 and the gain control loop only makes an adjustment to the desired value when the error is zero which means that capacitor C2 will not be charged or discharged.

Further, receiver circuit 100 also includes a comparator stage 112. This comparator stage 112, seen in FIG. 3, delivers the system output signal Vdout and includes a slider comparator circuit 113 which includes a comparator unit BC and a hysteresis unit BH and is powered by a voltage Vdd, the earth being called Vss.

Comparator unit BC is the unit through which the input and output of comparator stage 112 are arranged. The input of said comparator stage 112 is formed by two input terminals Bin+ and Bin− including a pair of N type transistors called M1 and M2. Terminal Bin+ is connected to transistor M1 and terminal Bin− is connected to transistor M2.

In the present case, terminal Bin+ is connected to the output of envelope detector circuit 108 whereas terminal Bin− is connected to the positive input terminal of operational transconductance amplifier 111, i.e. to reference signal Swref. The gates of these transistors M1 and M2 form the input terminals of the comparator stage. The comparator unit further includes a pair of P type transistors called M5 and M6. The drain of transistor M5 is connected to the drain of transistor M1, whereas the drain of transistor M6 is connected to the drain of transistor M2. The source of transistors M5 and M6 is connected to voltage Vdd, whereas the gates of these transistors M5 and M6 are connected to each other to form a connection point for applying a signal to activate the P type transistors.

Between the drains of M1 and M5 and the drains of M2 and M6, there are arranged two output connections Bm+ and Bm−. These connection points Bm+ and Bm− enter a circuit A2 which amplifies the gain of comparator stage 112 to obtain two output terminals Bout+ and Bout− of comparator stage 112. Output terminals Bout+ and Bout− deliver at output the output signal Vdout.

The source of transistor M1 and the source of transistor M2 are connected together to the drain of a first regulating N type transistor called M11, the source of which is connected to earth Vss, with a first regulating current Icmp traversing said transistor M11.

Hysteresis unit BH includes a first part formed of two pairs of transistors M7, M8 and M9, M10. Each pair of transistors includes two N type transistors. It is clear that transistors M7, M8 form a first pair, while transistors M9, M10 form a second pair. The sources of the transistors of each pair are connected to each other and are also connected to the drain of transistor M12.

This first part of hysteresis unit BH is also arranged to be respectively connected to connection point Bm−, i.e. the connection between the drain of M1 and the drain and M5 and to connection point Bm+, i.e. the connection between the drain of M2 and the drain and M6. To achieve this, the drain of transistor M7 and the drain of transistor M10 are respectively connected to connection point Bm− and to connection point Bm+. The drains of transistors M8 and M9 are connected so that the drain of M8 is connected to the drain of M10 and so that the drain of M9 is connected to the drain of M7.

Further, the gates of the transistors are connected in pairs so that the gates of transistors M7 and M10 are connected to each other and the gates of transistors M8 and M9 are connected to each other. This arrangement forms two connection points which are connected to outputs Bout+ and Bout− of comparator stage 112.

The configuration of the first part of hysteresis unit BH provides a hysteresis function associated with comparator unit BC. There is therefore obtained a conventional comparator circuit provided with a hysteresis function. The operation of this circuit consists, in comparator unit BC, of making the comparison between the detected signal Vout1 and the reference signal Vswref. Thus, hysteresis unit BH is used to complete this comparison by taking into account the output of said comparator stage 112 and the hysteresis signal.

In an advantageous variant, the hysteresis unit includes a second programmable part. This second part includes a pair of N type transistors called M3 and M4 whose sources are connected to each other. The drains of transistors M3 and M4 are connected to a second part. Consequently, the source of transistor M7 is connected to the source of transistor M8 and to the drain of transistor M3, whereas the source of transistor M9 is connected to the source of transistor M10 and to the drain of transistor M4. The sources of transistors M3 and M4 are connected to the drain of a second regulating transistor M12, whose source is connected to earth Vss, the gate of said transistor M12 being connected to the gate of transistor M11, a second regulating current Ihyst traversing said transistor M12. This configuration allows transistors M11 and M12 to form a connection point for applying a signal to activate the N type transistors. The gates of transistors M3 and M4 each form a connection terminal, respectively Bref+ and Bref−, used to modify the hysteresis.

Indeed, the hysteresis width of this circuit is dependent on the ratio between the current Ihyst connected to M12 and the current Icmp connected to M11. The hysteresis width may therefore be controlled by modifying this ratio Ihyst/Icmp. To achieve this, it should be considered that transistors M11 and M12 are each, in reality, formed of a multitude of transistors in parallel. This configuration allows the current to be distributed in the various transistors. Ideally, transistors M11 and M12 are each formed of the same number of transistors in parallel. When all the transistors for M11 and M12 are closed, a ratio is obtained between Ihyst and Icmp. To modify this ratio, the number of transistors that are closed simply needs to be modified. This causes an increase in the current flowing in each transistor. Consequently, the ratio between current Ihyst and current Icmp varies. For example, it is assumed that M11 and M12 each include 20 transistors in parallel so that Ihyst=Icmp. If the number of transistors M12 decreases to 10, while the number of transistors M11 remains constant at 20, Ihyst=0.5 Icmp is obtained and therefore a modified hysteresis width. It is consequently simple to modify the hysteresis width by switching more or fewer transistors.

Figure 3:
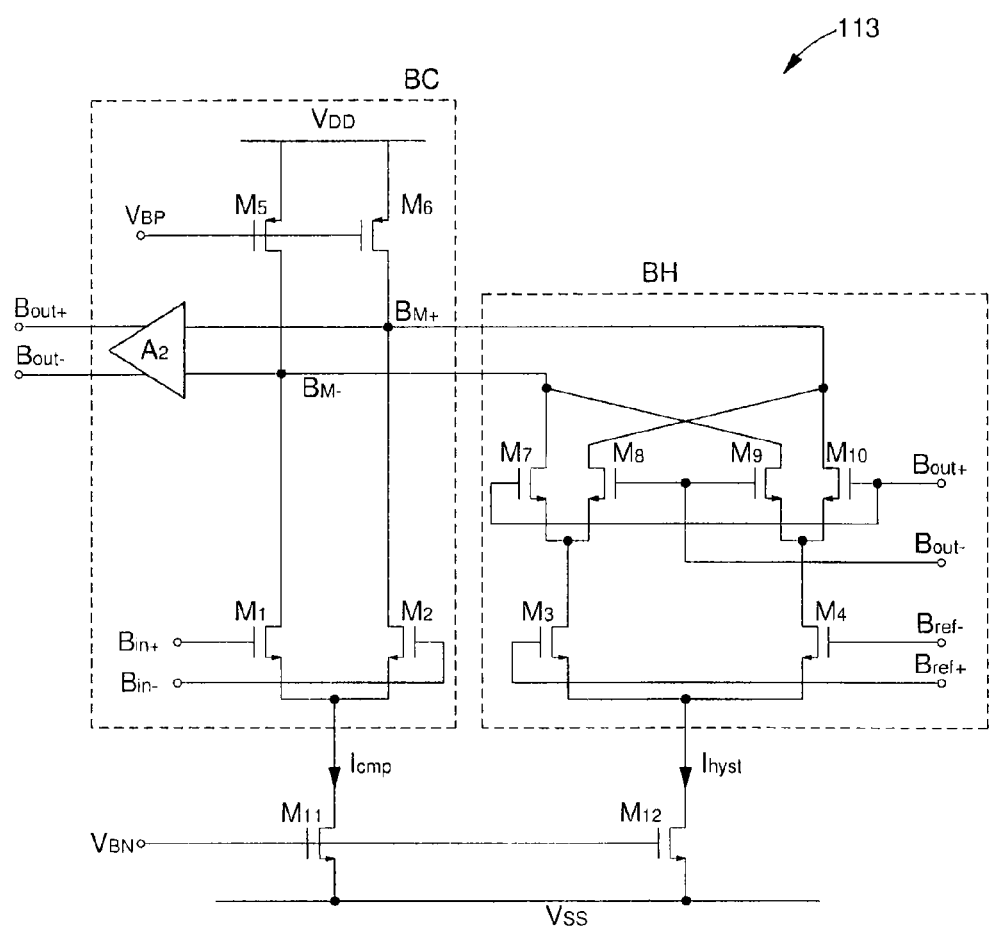
FIG. 3 is a schematic view of the comparator stage of the receiver system according to the invention.

It is also possible to modify the hysteresis width by using connection terminals Bref+ and Bref−. The signal sent into each of these connection terminals Bref+ and Bref− enables the current to be modified and thus the hysteresis width to be modified, as seen in FIG. 3. More specifically, increasing the voltage applied to connection point Bref+ increases the hysteresis width, i.e. there is a delay in the switch to change from a low level to a high level and the switch to change from a high level to a low level. Conversely, decreasing the hysteresis width brings the switches closer together. The hysteresis decreases the effect of noise on the signals. Consequently, this capacity to programme the hysteresis width has the advantage of adapting the noise reduction according to the incoming signal or components used.

Of course, it is possible to adjust the hysteresis width prior to manufacture by adapting, modifying the size of transistors M11 and M12.

It will be clear that various alterations and/or improvements and/or combinations evident to those skilled in the art may be made to the various embodiments of the invention set out above without departing from the scope of the invention defined by the annexed claims.

What is claimed is:

1. A receiver system including an input terminal through which an input signal is received, said receiver system further comprising:
   a first amplifier stage connected via one of a plurality of inputs to the input terminal of said receiver system and being configured to deliver an amplified signal;
   an envelope detector stage, connected to an output of the first amplifier stage, that is configured to detect maxima in the amplified signal to recover an envelope of the amplified signal and to deliver a signal;
   a second comparator stage including a negative input connected to an output of the envelope detector stage and a positive input to receive a reference signal, said second comparator stage being configured to compare the signal delivered at the output of the envelope detector stage to the reference signal to deliver a control signal, and to send the control signal to the first amplifier stage to vary a gain of the first amplifier stage; and a comparator circuit connected via a positive input to the output of the envelope detector stage and via a negative input to the positive input of the second comparator stage, the comparator circuit being configured to compare the output of the envelope detector stage to the reference signal, and to deliver a demodulated output signal based on the comparison, wherein the comparator circuit includes:
a comparator module configured to distinguish between the output signal from the envelope detector stage and the reference signal, and
a hysteresis module, wherein the hysteresis module includes two pairs of transistors of a same type each including a first transistor and a second transistor, wherein the transistors of the same pair are connected to earth, a gate of the first transistor of the first pair and a gate of the second transistor of the second pair are connected to each other to form a first connection point, and a gate of the second transistor of the first pair and a gate of the first transistor of the second pair are connected to each other to form a second connection point, wherein drains of the first transistor of the first pair and of the second transistor of the second pair are connected to the comparator module, and the drains of the second transistor of the first pair and of the first transistor of the second pair are respectively connected to the drain of the second transistor of the second pair and to the drain of the first transistor of the first pair, and wherein the hysteresis module further includes a programmable part including two programming transistors each connected via a drain thereof to the sources of the transistors of one of the two pairs of transistors of the hysteresis module, sources of said two programming transistors being connected to earth, and in that the gates of each said programming transistor form a connection point to receive a programming signal.

2. The receiver system according to claim 1, wherein the envelope detector stage further includes a capacitor.

3. The receiver system according to claim 1, wherein the comparator module is connected to earth via a first regulating transistor traversed by a first regulating current, the hysteresis module being connected to the earth via a second regulating transistor traversed by a second regulating current, a hysteresis width being linked to a ratio between the second regulating current and the first regulating current.

4. The receiver system according to claim 2, wherein the comparator module is connected to earth via a first regulating transistor traversed by a first regulating current, the hysteresis module being connected to the earth via a second regulating transistor traversed by a second regulating current, a hysteresis width being linked to a ratio between the second regulating current and the first regulating current.

5. The receiver system according to claim 3, wherein the first regulating transistor and the second regulating transistor are each formed of a multitude of transistors in parallel, each able to be selectively activated or deactivated, and in that the ratio between the second regulating current and the first regulating current is regulated by modifying a number of transistors activated for the first regulating transistor and for the second regulating transistor.

6. The receiver system according to claim 4, wherein the first regulating transistor and the second regulating transistor are each formed of a multitude of transistors in parallel, each able to be selectively activated or deactivated and in that the ratio between the second regulating current and the first regulating current is regulated by modifying a number of transistors activated for the first regulating transistor and for the second regulating transistor.

7. The receiver system according to claim 1, wherein the comparator module performs the distinguishing by making a comparison between the output signal from the envelope detector stage and the reference signal, the comparing including calculating the mean of the delivered signal and comparing this mean to the value of the reference signal.

* * * * *